United States Patent [19]
Kashiwa et al.

[11] Patent Number: 5,705,847
[45] Date of Patent: Jan. 6, 1998

[54] SEMICONDUCTOR DEVICE

[75] Inventors: Takuo Kashiwa; Makio Komaru, both of Tokyo, Japan

[73] Assignee: Mitsubishi Denki Kabushiki Kaisha, Tokyo, Japan

[21] Appl. No.: 760,721

[22] Filed: Dec. 5, 1996

[30] Foreign Application Priority Data

Jun. 10, 1996 [JP] Japan .................... 8-146986

[51] Int. Cl.$^6$ .................. H01L 27/095; H01L 29/47; H01L 29/812; H01L 31/07
[52] U.S. Cl. .................. 257/476; 257/471
[58] Field of Search .................. 257/476, 471

[56] References Cited

U.S. PATENT DOCUMENTS 5,109,256  4/1992  De Long .................. 257/476
5,202,649  4/1993  Kashiwa .

OTHER PUBLICATIONS

Remshardt et al, "Surface controlled semiconductor . . . " IBM Tech Discl, vol. 14 No. 9 Feb. 92, p. 2592.

*Primary Examiner*—Stephen Meier
*Attorney, Agent, or Firm*—Leydig, Voit & Mayer, Ltd.

[57] ABSTRACT

A semiconductor device includes a semiconductor substrate on which are successively disposed, a semiconductor laminated layer structure including at least two semiconductor layers, a first semiconductor layer containing a first dopant impurity providing a first conductivity type, and a second semiconductor layer containing the first dopant impurity in a concentration higher than in the first semiconductor layer. A semiconductor diode includes a first electrode in ohmic contact with the second semiconductor layer, and a second electrode in Schottky contact with the second semiconductor layers. A transistor includes a gate electrode in the recess and making a Schottky contact with the first semiconductor layer, and a source electrode and a drain electrode disposed on opposite sides of the recess on the second semiconductor layer, and in ohmic contact with the second semiconductor layer. The region in the diode where the depletion layer extends is broadened, and the capacitance of the diode varies linearly and is controllable over a wide range.

6 Claims, 9 Drawing Sheets ns,847

SEMICONDUCTOR DEVICE

FIELD OF THE INVENTION

The present invention relates to a semiconductor device including a variable-capacitance element that controls a capacitance with an applied voltage, and a method of fabricating the semiconductor device.

BACKGROUND OF THE INVENTION

Characteristics of a semiconductor diode in which capacitance and resistance vary with applied voltage have been utilized. In a microwave circuit and a millimeter wave circuit, a diode has been used as a variable-capacitance element varying with applied voltage, and, more particularly, a diode has been used for varying an operation frequency of a circuit with the capacitance.

As the prior art diode, a solid-state structure which is typically a longitudinally laminated structure has been mainly used. Recently, in microwave circuit and millimeter wave circuits, a transistor and a diode have been integrated in a monolithic circuit by a semiconductor fabricating technique. A monolithic microwave integrated circuit (hereinafter referred to as MMIC), wherein a capacitor and a transmission line are further integrated, in addition to the transistor and the diode, is highly developed, so a microwave circuit used for a device such as a portable telephone is mainly used.

On an other hand, in the MMIC, a high electron mobility transistor (hereinafter referred to as HEMT) has been frequently used as a transistor operating at ultra high frequency, specifically at millimeter wave. In the fabrication of the microwave circuit and the millimeter wave circuit on a semiconductor substrate, it is necessary to form the transistor, such as the HEMT, and the diode on the same substrate. For example, in oscillators and the like, the transistor is used as an oscillating element and the diode is used as a tuning circuit for varying the frequency, respectively.

FIG. 12 is a cross-sectional view illustrating a prior art semiconductor device in which a diode and a HEMT are formed on the same substrate so as to have the same semiconductor laminated layer structure. In FIG. 12, reference numeral 100 designates a diode and numeral 200 designates an HEMT. Reference numeral 5 designates a semi-insulating GaAs substrate, numeral 4 designates a buffer layer, numeral 3 designates an undoped InGaAs electron transit layer, numeral 2 designates an n type AlGaAs electron supply layer, and numeral 1 designates a cap layer. The cap layer 1 is doped with an n type dopant impurity having a higher dopant concentration than the electron supply layer 2 to reduce the resistance of source and drain electrodes in ohmic contact with the cap layer 1. The buffer layer 4, the electron transit layer 3, the electron supply layer 2, and the cap layer 1 are successively laminated on the substrate 5 to form a semiconductor laminated layer structure. Reference numerals 7 and 9 designate source and drain electrodes, each comprising AuGe/Ni/Au. Reference numeral 8a designates a gate recess having a bottom on which the electron supply layer 2 is exposed and numeral 8 designates a gate electrode comprising Ti/Al/Mo and making a Schottky contact with the electron supply layer 2. Reference numeral 38a designates a recess having a bottom at which the electron supply layer 2 is exposed and numeral 38 designates an anode electrode comprising Ti/Al/Mo and making a Schottky contact with the electron supply layer 2. The recess 38a and the anode electrode 38 are formed simultaneously with the gate recess 8a and the gate electrode 8. Reference numeral 10 designates cathode electrodes comprising AuGe/Ni/Au, making an ohmic contact with the cap layer 1, and disposed at opposite sides of the anode electrode 38 and short-circuited to each other. Reference numeral 12 designates a protective film (passivation film) comprising an insulating film such as $SiO_x$, numeral 11 designates a wiring metal layer comprising Ti/Au, and numeral 6 designates an isolation region for separating the diode 100 and the HEMT 200, which region is made electrically insulating by proton bombardment.

A description is given of a fabricating method. Initially, the buffer layer 4, the electron transit layer 3, the electron supply layer 2, and the cap layer 1 are successively epitaxially grown on the substrate 5 by metal-organic chemical vapor deposition (MOCVD) to form the semiconductor laminated layer structure. Next, the isolation region 6 is formed by bombardment with protons between the region of the semiconductor laminated layer structure where the HEMT is to be formed and the region where the diode is to be formed. Subsequently, AuGe/Ni/Au for forming a source electrode, a drain electrode, and a cathode electrode are disposed on the cap layer 1, followed by heat treatment to form the source electrode 7, the drain electrode 9, and the cathode electrodes 10, all of which are in ohmic contact with the cap layer 1. After the resist is deposited on the entire semiconductor laminated layer structure (not shown), openings are formed by photolithography on parts of the resist where the gate recess 8a and the recess 38a are to be formed and, using the resist as a mask, the cap layer 1 is wet-etched to form the gate recess 8a and the recess 38a. Further, using the resist as a mask, Ti/Al/Mo are deposited on the resist and, then, Ti/Al/Mo and the resist are lifted off to form the gate electrode 8 and the anode electrode 38. After the protective film 12 is formed on the entire semiconductor laminated layer structure, openings are provided in regions of the protective film 12 corresponding to the respective electrodes, and the wiring metal layers 11 are formed on the openings of the protective film 12, resulting in the semiconductor device shown in FIG. 12.

Next, a description is given of operation. In the HEMT 200, since the electron supply layer 2 including an n type dopant impurity is disposed on the undoped electron transit layer 3, a two-dimensional electron gas layer is formed at the interface between the electron supply layer 2 and the electron transit layer 3, and electrons transit through the two-dimensional electron gas layer. Further, since the two-dimensional electron gas layer has no donor ions obstructing the transit of electrons, each electron has high electron mobility.

In the diode 100, when a minus voltage is applied to the anode electrode 38, the depletion layer formed directly below the anode electrode 38 extends in accordance with the applied voltage, thereby varying the capacitance in the diode 100. Such a diode that varies in capacitance with the applied voltage is called a varactor diode.

The capacitance in the diode 100 depends on the size of the depletion layer formed in the active layer which is doped with impurities directly below the anode electrode 38, and the size of the depletion layer is changed by the voltage applied to the anode electrode 38, thereby controlling the capacitance of the diode 100. Since it is impossible to increase the capacitance of the diode 100 endlessly with the applied voltage, and, the capacitance is controlled by the thickness of the active layer on the semiconductor substrate 5 and doped with impurities, because the depletion layer extends to the interface between the active layer and the insulating layer with the applied voltage.

As described above, in the prior art semiconductor device in which the diode and the transistor including a cap layer for ohmic contact, such as an HEMT, are formed from the same semiconductor laminated layer structure, the diode and the transistor have nearly the same structures and they are simultaneously formed, thereby simplifying the fabricating process. In a transistor such as the HEMT, a recess is produced to maintain the efficiency of the transistor, the same recess is formed for the diode as in the transistor, and the anode electrode is disposed in the recess. The recess and the anode electrode are formed simultaneously with the gate recess and the gate electrode. For example, although in the HEMT the recess reaches the interface between the cap layer 1 and the electron supply layer 2, considering gate breakdown voltage, the recess reaching the interface between the cap layer and the electron supply layer is produced also in the diode. Therefore, the active layer below the anode electrode, i.e., the layer including charge carriers, has the same thickness as the active layer below the gate electrode, i.e., the electron supply layer 2. However, since the electron supply layer 2 directly below the gate electrode in the HEMT is very thin, the active layer below the gate electrode, i.e., the electron supply layer 2, is also thin, so the region in the diode 100 where the depletion layer extends below the anode electrode 38 is very narrow, and the region for varying the voltage to vary the capacitance is comparatively narrow.

When the diode is used to vary the capacitance with the applied voltage, it is desired that the capacitance varies widely and its variation be linear with the applied voltage. On the other hand, when the diode and the transistor including a cap layer for ohmic contact, such as the HEMT, are formed on the same semiconductor laminated layer structure, the region where the capacitance in the diode is controlled is determined by the thickness of the active layer directly below the gate electrode in the transistor, and the thickness of the active layer is very thin. Accordingly, the region where the capacitance in the diode varies linearly with the applied voltage is narrow, and the variable range of the oscillation frequency of an oscillator is narrow, whereby a semiconductor device having desired characteristics is not obtained.

SUMMARY OF THE INVENTION

It is an object of the present invention to provide a semiconductor device in which a transistor including a layer for ohmic contact and a diode are formed from the same semiconductor laminated layer structure and the region over which the capacitance in the diode is controlled is widened.

It is another object of the present invention to provide a method of fabricating a semiconductor device in which a transistor including a layer for ohmic contact and a diode are formed from the same semiconductor laminated layer structure and the region over which the capacitance in the diode is controlled is widened.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, a semiconductor device comprises a semiconductor substrate; a semiconductor laminated layer structure comprising at least two semiconductor layers, the semiconductor laminated layer structure having, on a top surface thereof, a first semiconductor layer containing a first dopant impurity producing a first conductivity type, and a second semiconductor layer disposed on the first semiconductor layer, the second semiconductor containing the first dopant impurity at a concentration higher than the first semiconductor layer; a semiconductor diode comprising a first electrode in ohmic contact with the second semiconductor layer, and a second electrode in Schottky contact with the second semiconductor layer; and a semiconductor transistor located in a recess provided on the second semiconductor layer and having a depth enough to reach the first semiconductor layer, the semiconductor transistor having a gate electrode exposed in the recess and making a Schottky contact with the first semiconductor layer, and a source electrode and a drain electrode disposed in regions opposing to each other with respect to the recess in the second semiconductor layer, the above electrodes in ohmic contact with the above regions. Since, in the semiconductor device in which the semiconductor diode and the semiconductor transistor are integrated on the same semiconductor laminated layer structure, the thickness of the layer including a carrier and positioned below the second electrode in the diode is increased by the thickness of the second semiconductor layer as compared with the case where the recess is formed in the second semiconductor layer to form the diode in the prior art. Therefore, the region in the diode where the depletion layer extends is broadened, and the region where the capacitance in the diode varies linearly is widened, whereby the capacitance in the diode is widely controlled.

According to a second aspect of the present invention, in the semiconductor device, the first electrode, the source electrode, and the drain electrode are respectively connected to a plurality of wiring metal layers, and the second electrode comprises the same material as the wiring metal layer. Therefore, the second electrode is formed simultaneously with the wiring metal layer, whereby the fabricating process is simplified. Further, the diode is formed without adding a new step to the step for forming the transistor having the wiring metal layer.

According to a third aspect of the present invention, in the semiconductor device, a protective film is disposed between the first electrode and the second semiconductor layer. Therefore, the region in the diode where the depletion layer extends is broadened by the thickness of the protective film, whereby the capacitance in the diode is widely controlled.

According to a fourth aspect of the present invention, the semiconductor device includes a third electrode in ohmic contact with the second semiconductor layer, the third electrode being placed at the same spacing as that between the first electrode and the second electrode, in regions opposing to each other with respect to the recess in the second semiconductor layer; and means for applying different voltages to the first electrode and the third electrode, respectively, the means being connected to the electrodes respectively. Therefore, the potential difference is generated between the first and third electrodes, and the depletion layer extends with inclined to any of directions of the first and third electrodes, whereby the region in the diode where the depletion layer extends is broadened, and the capacitance in the diode is widely controlled.

According to a fifth aspect of the present invention, the semiconductor device includes a third electrode in ohmic contact with the second semiconductor layer in regions opposing to each other with respect to the recess in the second semiconductor layer, wherein the second electrode is located at a position offset from a midway between the first electrode and the third electrode, and the first and third electrodes are connected with each other. Therefore, the depletion layer extends with inclined to any of directions of the first and third electrodes, whereby the region in the diode where the depletion layer extends is broadened, and the capacitance in the diode is widely controlled.

According to a sixth aspect of the present invention, in the semiconductor device, the semiconductor laminated layer structure comprises a buffer layer, an undoped electron transit layer, an electron supply layer containing a first dopant impurity, and a cap layer containing the first dopant impurity at a higher concentration than the electron supply layer, which are successively disposed on the semiconductor substrate. Therefore, the HEMT having the cap layer for ohmic contact is formed.

According to a seventh aspect of the present invention, a method of fabricating a semiconductor device includes the steps of: preparing a semiconductor substrate; forming on the semiconductor substrate a semiconductor laminated layer structure comprising at least two semiconductor layers wherein a first semiconductor layer containing a first dopant impurity is disposed on a top surface of the semiconductor substrate, and a second semiconductor layer containing the first dopant impurity at a concentration higher than the first semiconductor layer is disposed on the first semiconductor layer; depositing on the semiconductor laminated layer structure a material for forming a first electrode, a source electrode and a drain electrode, followed by heat treatment to form the first electrode, the source electrode and the drain electrode, all of which are in ohmic contact with the second semiconductor layer; forming a resist on the semiconductor laminated layer structure, forming in the resist an opening in a region between the source electrode and the drain electrode, and etching the second semiconductor layer using the resist as a mask, so that the first semiconductor layer is exposed to form a gate recess; depositing a material for a gate electrode on the semiconductor laminated layer structure using the resist as a mask, and removing the resist to form the gate electrode on the first semiconductor layer being exposed in the gate recess; and forming a second electrode in Schottky contact with the second semiconductor layer, in a vicinity of the first electrode on the second semiconductor layer. Therefore, the region in the diode where the depletion layer extends is broadened, whereby the region where the capacitance in the diode varies linearly with the anode voltage is widened.

According to an eighth aspect of the present invention, the method of fabricating the semiconductor device includes forming wiring metal layers connected with the first electrode, the source electrode, and the drain electrode, and each having the same material as the second electrode, simultaneously with the second electrode. Therefore, the anode electrode is formed simultaneously with the step for forming the wiring metal layer, whereby the diode is formed simultaneously with the HEMT without adding a new step to the step for forming the HEMT, resulting in a simplification of the fabricating process.

DETAILED DESCRIPTION OF THE PREFERRED EMBODIMENTS

Embodiment 1

Figure 1:
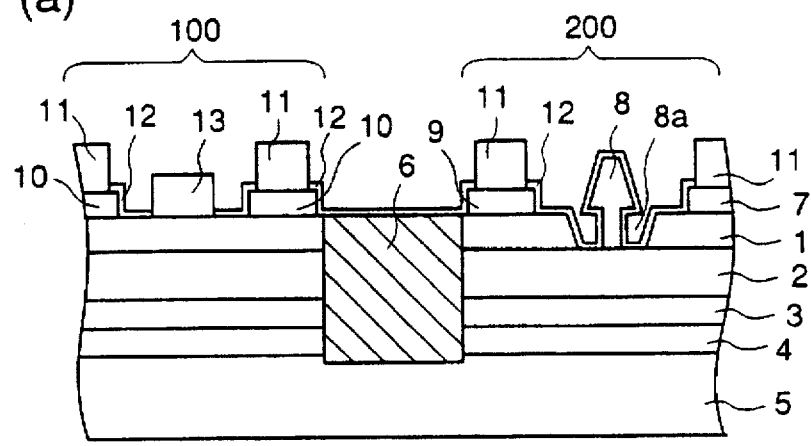
FIG. 1(a) is a sectional view illustrating a semiconductor device in accordance with a first embodiment of the present invention.
FIG. 1(b) is a plan view of the semiconductor device viewed from above the substrate.
FIG. 1(c) is a graph showing a relation between anode voltage and junction capacitance of the diode.
Figure 1:
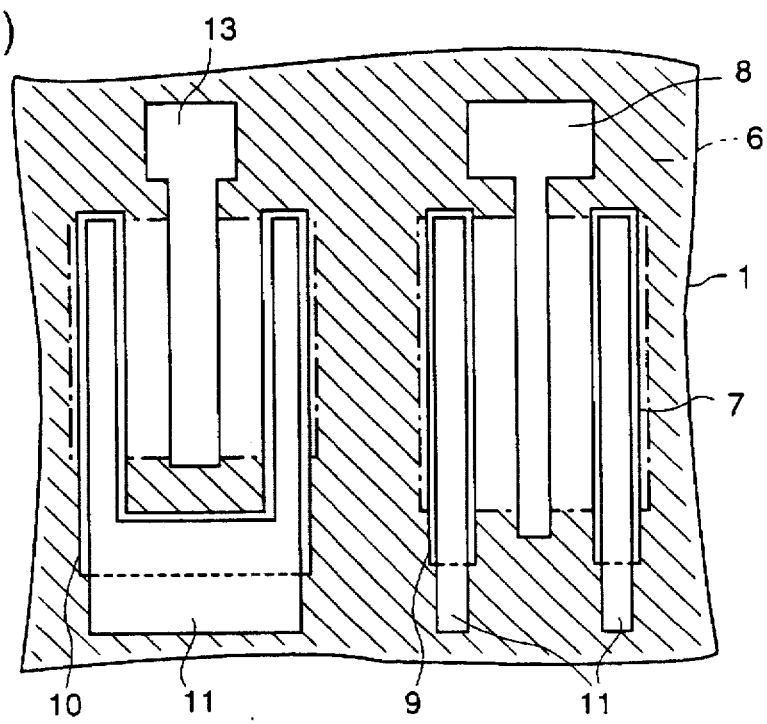
Figure 1:
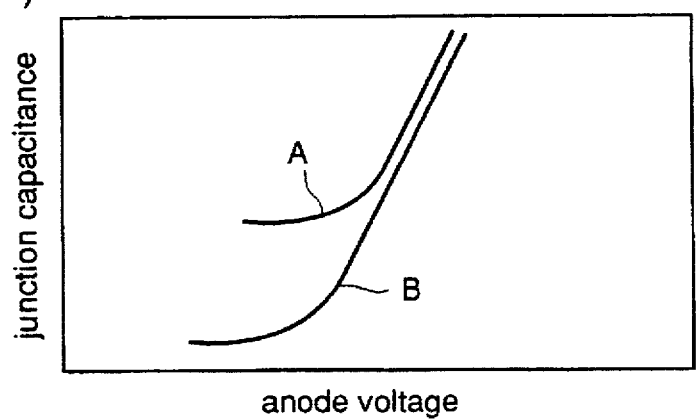

FIG. 1(a) is a cross-sectional view illustrating a semiconductor device in accordance with a first embodiment of the present invention, FIG. 1(b) is a plan view of the semiconductor device viewed from above a substrate, and FIG. 1(c) is a graph showing a relation between anode voltage and junction capacitance in a diode of the semiconductor device. In the semiconductor device, a diode and a transistor, especially an HEMT, are integrated on the same substrate an have the same semiconductor laminated layer structure. In FIG. 1(a), reference numeral 100 designates a diode and numeral 200 designates an HEMT. Reference numeral 5 designates a semi-insulating GaAs substrate. Reference numeral 4 designates an undoped GaAs buffer layer 4. Reference numeral 3 designates an undoped InGaAs electron transit layer having a thickness of 80–250 Å. Reference numeral 2 designates an n type AlGaAs electron supply layer having a dopant concentration of $1 \times 10^{17} - 2 \times 10^{19} \text{cm}^{-3}$ and a thickness of 300–500 Å. Reference numeral 1 designates an n type cap layer having a dopant concentration of $1 \times 10^{18} - 2 \times 10^{19} \text{cm}^{-3}$ and a thickness of 300–2000 Å. Instead of the n type AlGaAs electron supply layer, there may be used undoped AlGaAs including a planar-doped layer which is formed, at a predetermined height on the substrate 5, by a planar-doping method such that the planar-doped layer has a thickness equivalent to several atomic layers and a dopant concentration of $1 \times 10^{12} - 7 \times 10^{12} \text{cm}^{-2}$. The cap layer 1 has a higher dopant concentration than the electron supply layer 2 to reduce resistance of source and drain electrodes in ohmic contact with the cap layer 1. The buffer layer 4, the electron transit layer 3, the electron supply layer 2, and the cap layer 1 are successively laminated on the substrate 5 to form a semiconductor laminated layer structure. Reference numerals 7 and 9 designate source and drain electrodes each comprising AuGe/Ni/Au. Reference numeral 8a designates a gate recess having a bottom at which the electron supply layer 2 is exposed. Reference numeral 8 designates a gate electrode comprising Ti/Al/Mo and making a Schottky contact with the electron supply layer 2. Reference numeral 11 designates a wiring metal layer comprising Ti/Au. Reference numeral 13 designates an anode electrode making a Schottky contact with the cap layer 1. Any material making a Schottky contact with the cap layer 1 may be used. Especially, the anode electrode 13 comprises the same material as the wiring metal layer 11 and is formed simultaneously with the wiring metal layer 11, thereby simplifying the step for forming the anode electrode 13. Reference numeral 10 designates cathode electrodes. The cathode electrodes 10, each comprising AuGe/Ni/Au and making an ohmic contact with the cap layer 1, are disposed on opposite sides of the anode electrodes 13 at equal spacing, and they are short-circuited to each other (not shown). The cathode electrodes 10 are not always be disposed on opposite sides of the anode electrode 13, and one cathode electrode may be disposed on one side of the anode electrode 13. However, in order to reduce the resistance between the anode electrode and the cathode electrode, the cathode electrodes 10 are preferably disposed on opposite sides of the anode electrode 13. Reference numeral 12 designates a protective film comprising an insulating film such as $SiO_x$. Reference numeral 6 designates an isolation region for separating the diode 100 and the HEMT 200, which region is made insulating by proton bombardment.

FIGS. 2(a)–2(e) are cross-sectional views illustrating a method of fabricating the semiconductor device according to the first embodiment of the invention. In these figures, the same reference numerals as in FIG. 1(a) designate the same or corresponding parts. Reference numeral 14 designates a photoresist.

The method of fabricating the semiconductor device includes forming the electron supply layer having the desired characteristics on the GaAs semi-insulating substrate 5 by epitaxial growth and ion implantation. Especially, the epitaxial growth method will be explained.

Figure 2:
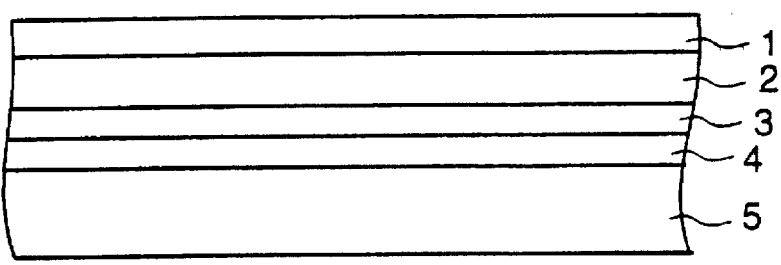
FIGS. 2(a)–2(e) are sectional views illustrating a method of fabricating the semiconductor device according to the first embodiment.
Figure 2:
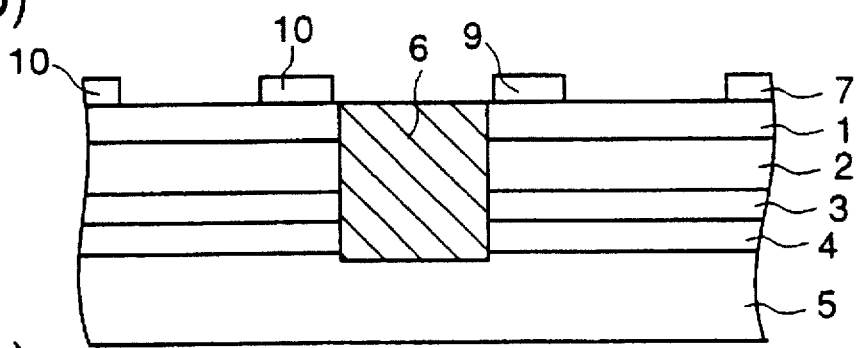
Figure 2:
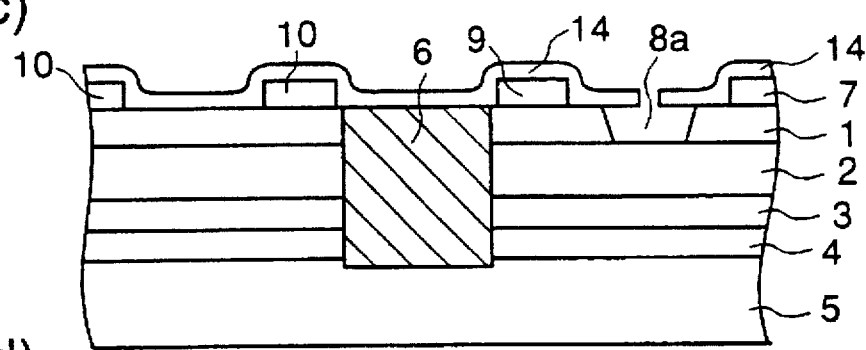
Figure 2:
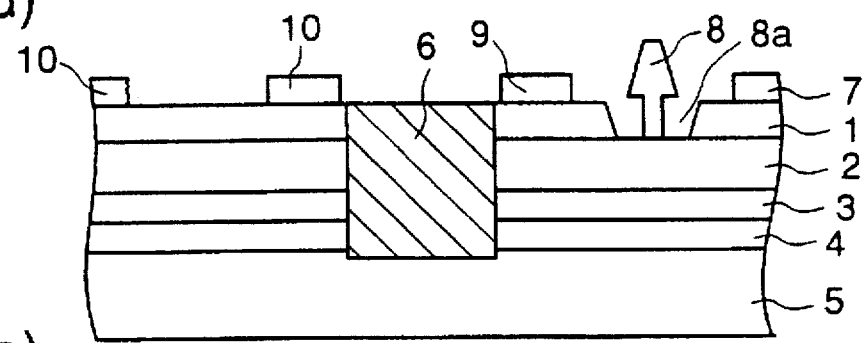
Figure 2:
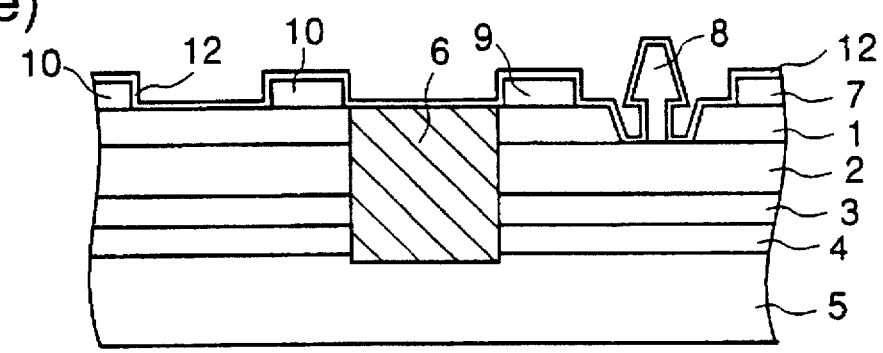

Initially, in the step of FIG. 2(a), the buffer layer 4, the electron transit layer 3, the electron supply layer 2, and the cap layer 1 are successively epitaxially grown on the semi-insulating substrate 5 by MOCVD to complete the semiconductor laminated layer structure. Next, in the step of FIG. 2(b), protons bombard a region not required for forming elements, other than the regions where the diode and the HEMT of the semiconductor laminated layer structure are to be formed, to form the isolation region 6. Thereafter, a material for forming a source electrode, a drain electrode, and a cathode electrode is deposited on the cap layer 1, followed by heat treatment to form the source electrode 7, the drain electrode 8, and the cathode electrodes 10, all of which are in ohmic contact with the cap layer 1.

Subsequently, in the step of FIG. 2(c), the photoresist 14 is deposited on the whole surface of the semiconductor laminated layer structure and patterned by electron beam (hereinafter referred to as EB) exposure and optical exposure and, then using the resist 14 as a mask, the cap layer 1 is isotropically or anisotropically etched to form the gate recess 8a. The gate recess 8a has a depth reaching the electron supply layer 2. Further, in the step of FIG. 2(d), using the resist 14 as a mask, a gate electrode material having a barrier metal, such as Ti, which does not easily mix with the semiconductor layer, even by annealing is evaporated. Thereafter, the gate electrode material and the resist 14 are lifted off, whereby the gate electrode 8 making a Schottky contact with the electron supply layer 2 is formed.

In the step of FIG. 2(e), the protective film 12, such as SiN and $SiO_x$, is formed on the entire surface of the semiconductor laminated layer structure. Thereafter, regions of the protective film 12 on the gate electrode 8, the drain electrode 7, the source electrode 9, and the cathode electrodes 10 are etched so that these electrodes make contact with the wiring metal. Here, the protective film 12 on the region for forming the anode electrode, sandwiched between the cathode electrodes 10, is also etched to expose the cap layer 1. Subsequently, a metal including a barrier metal, such as Ti, for example, multiple metal layers such as Ti/Au, is metallized to form the wiring metal layer 11. Since the protective film 12 on the region for forming the anode electrode is also etched and removed, the anode electrode 13 comprising the same material as the wiring metal layer 11 and making a Schottky contact with the cap layer 1 is formed, thereby completing the semiconductor device as shown in FIG. 1(a).

A description is given of the operation of the semiconductor device. In the HEMT 200, the electron supply layer 2 including a dopant impurity producing n type conductivity is disposed on the undoped electron transit layer 3, and the gate electrode 8 is disposed on the electron supply layer 2. At the interface between the electron supply layer 2 and the electron transit layer 3, a two-dimensional electron gas layer is formed, through which electrons transit. Since the two-dimensional electron gas layer has no donor ions preventing the transit of electrons, each electron has high electron mobility. Then, the voltage applied to the gate electrode 8 varies, whereby the concentration of two-dimensional electron gas below the gate electrode 8 varies and the two-dimensional electron gas layer functions as a transistor.

In the diode 100, the anode electrode 13 is disposed on the cap layer 1 so that it is in Schottky contact with the cap layer 1, and a depletion layer that is generated when the metal and semiconductor are contact each other is produced below the anode electrode 13. When a minus voltage is applied to the anode electrode 13, the depletion layer produced directly below the anode electrode 13 extends in response to the applied voltage, whereby the capacitance in the diode 100 varies.

Figure 12:
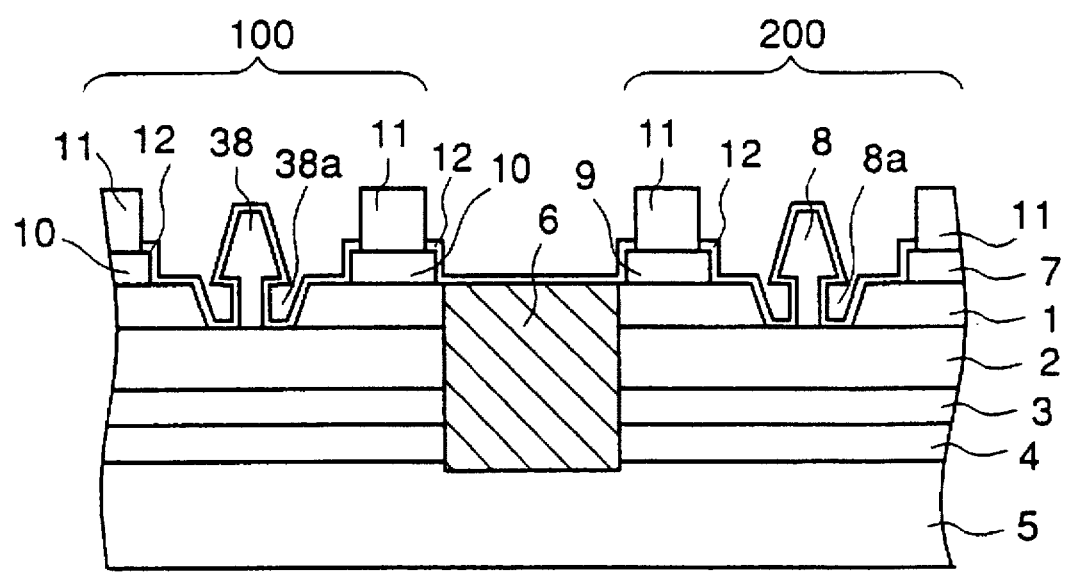
FIG. 12 is a sectional view illustrating a prior art semiconductor device.

According to the first embodiment, in the semiconductor device in which the diode 100 and the HEMT 200 including the cap layer for ohmic contact are integrated on the same semiconductor laminated layer structure, the anode electrode 13 in the diode 100 makes a Schottky contact with the cap layer 1 which is exposed in an opening of the protective film 12 on the cap layer 1. Accordingly, in the prior art semiconductor device in which the diode and the HEMT are integrated on the same semiconductor laminated layer structure as shown in FIG. 12, since the anode electrode in the diode is disposed on the electron supply layer exposed in a recess of the cap layer, the region where the depletion layer extends in the substrate direction is limited to the thickness of the electron supply layer including carriers, so that the region where the depletion layer extends in response to the voltage is narrowed. On the other hand, in the present invention, since the diode 100 includes no recess in the cap layer 1, the region where the depletion layer extends in the substrate direction is the same as the total thickness of the electron supply layer 2 and the cap layer 1, whereby the region where the depletion layer in the diode 100 extends is larger than that of the prior art semiconductor device. Therefore, the relation between the anode voltage applied to the anode electrode 13 and the junction capacitance in the diode as shown in FIG. 1(c). In FIG. 1(c), the abscissa represents the anode voltage, the ordinate represents the junction capacitance, a curve A shows the prior art diode, and a curve B shows the diode according to the first embodiment. In the diode according to the first embodiment, the region where the junction capacitance varies linearly in response to the anode voltage is broadened as compared with in the prior art diode.

Further, in the first embodiment of the invention, since the anode electrode 13 comprises the same material as the wiring metal layer 11 and is formed simultaneously with the wiring metal layer 11, it is not necessary to add a specific step for forming the anode electrode 13, thereby forming the diode 100 using the usual step for forming the HEMT without adding a new process thereto. Accordingly, since the diode 100 is formed simultaneously with the step for forming the HEMT 200, the fabricating process is not more complex as compared to the prior art semiconductor device.

As described above, the semiconductor device according to the first embodiment includes a semiconductor laminated layer structure in which the buffer layer 4, the electron transit layer 3, the electron supply layer 2, and the cap layer 1 are disposed on the semiconductor substrate 5, the diode 100 including the cathode electrode 10 disposed on the cap layer 1 and makes an ohmic contact with the cap layer 1, and the anode electrode 13 is disposed on the cap layer 1 and makes a Schottky contact with the cap layer 1, the HEMT 200 includes the gate electrode 8 disposed on the electron supply layer 2 exposed in the gate recess 8a, which is produced on the cap layer 1 and has a depth reaching the electron supply layer 2, and makes a Schottky contact with the electron supply layer, and the source electrode 7 and the drain electrode 9 each making an ohmic contact with regions on the cap layer 1 on opposite sides of the gate recess 8a. Therefore, in the semiconductor device in which the diode and the HEMT including the cap layer for ohmic contact are integrated on the same semiconductor laminated layer structure, the region in the diode where the depletion layer extends is broadened, whereby the region where the capacitance in the diode varies linearly is widened.

Since the wiring metal layers 11 are deposited on the cathode electrodes 10, the source electrode 7, and the drain electrode 9, and the anode electrode 13 comprises the same material as the wiring metal layer 11, the anode electrode 13 is formed simultaneously with the step for forming the wiring metal layer 11, whereby the diode 100 is formed simultaneously with the step for forming the HEMT 200 without adding a new step thereto, and the fabricating process is simplified.

A description is given of a circuit using the semiconductor device according to the first embodiment.

Figure 3:
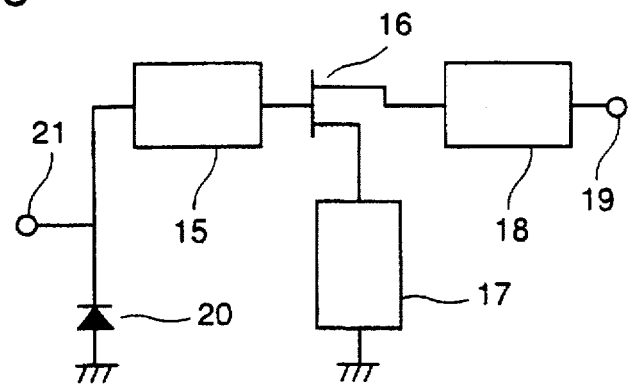
FIG. 3 is a diagram illustrating a microwave circuit using the semiconductor device according to the first embodiment.

FIG. 3 is a schematic view illustrating a microwave circuit using the semiconductor device according to the first embodiment. Particularly, the microwave circuit has an oscillation function (hereinafter referred to as an oscillator). The oscillator is called a series feedback type oscillator generally.

In FIG. 3, reference numeral 20 designates a diode of the semiconductor device according to the first embodiment, numeral 21 designates a terminal for external modulation, numeral 15 designates an oscillation circuit, numeral 16 designates a transistor for oscillation, such as HEMT, numeral 17 designates a series feedback circuit, numeral 18 designates an output circuit, and numeral 19 designates an output terminal. The HEMT included in this circuit comprises the HEMT of the semiconductor device according to the first embodiment, and the HEMT and the diode 20 are formed on the same semiconductor laminated layer structure.

In this circuit, a signal has a loop gain in accordance with the feedback circuit, and oscillation occurs when impedance of the device reaches a condition corresponding to a certain frequency. Since the resonance circuit 15 determines an oscillation frequency mainly, the diode functioning as a varactor usually is connected to the resonance circuit 15, and the capacitance of the diode is electrically varied, thereby changing a phase component of an impedance of a resonator. When the frequency is modulated, the oscillation frequency is required to vary linearly and widely with the modulated voltage. In such a voltage control oscillator that varies the oscillation frequency in response to the voltage, when the above-described diode 20 is used, the range where the oscillation frequency varies linearly is broadened so long as the region where the depletion layer extends is broadened, as compared with a diode produced by short-circuiting the electrodes corresponding to the source and drain electrodes as in the prior art HEMT.

Figure 4:
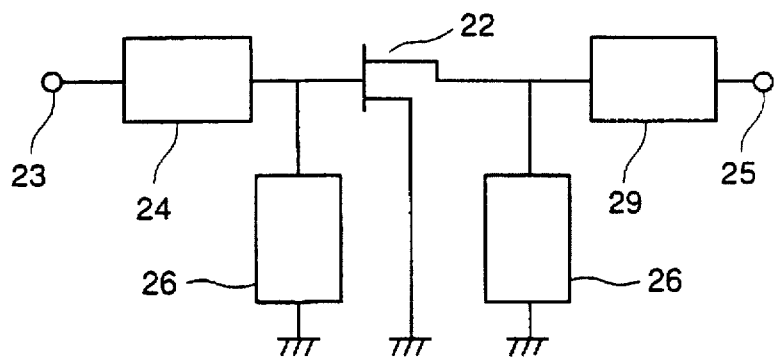
FIG. 4(a) is a diagram illustrating another microwave circuit using the semiconductor device according to the first embodiment.
FIG. 4(b) is a diagram showing a phase control circuit in FIG. 1(a) according to detail.
FIG. 4(c) is a graph showing a relation between gain and frequency characteristics when the voltage of the diode is changed.
Figure 4:
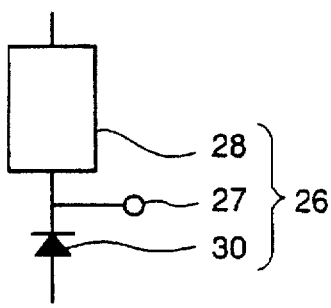
Figure 4:
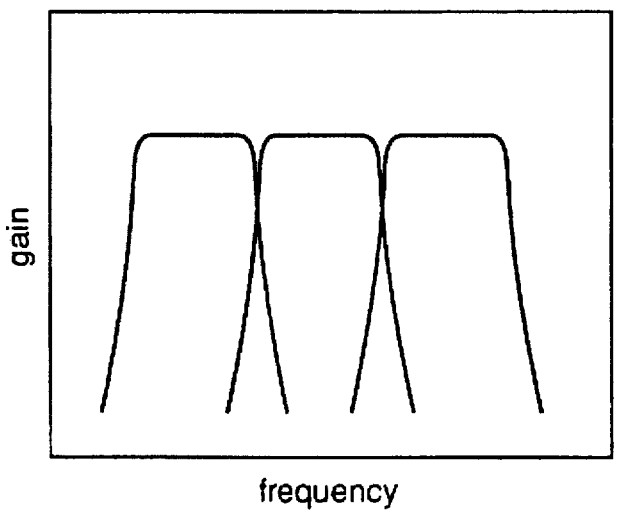

Even when the semiconductor device according to the first embodiment is used for a circuit that controls passing phase according to the junction capacitance of the diode, such as an analog phase shifter, the variable range of the passing phase is widened. FIG. 4(a) is a schematic view illustrating an impedance circuit for zone controlling disclosed in the U.S. Pat. No. 5,202,649, FIG. 4(b) is a diagram illustrating the phase control circuit in FIG. 4(a) in detail, and FIG. 4(c) is a graph showing frequency characteristics relation between frequency and gain when the voltage of the diode is changed.

In these figures, reference numeral 22 designates a transistor, numeral 23 designates an input terminal, numeral 24 designates an input side matching circuit, numeral 29 designates an output circuit, numeral 25 designates an output terminal, and numeral 26 designates a phase control circuit. The phase control circuit 26 comprises a strip line 28 having a ¼ wavelength of the design frequency, a control terminal 27, and a diode 30. In the circuit, using the diode of the semiconductor device according to the first embodiment as the diode 30, the range of zone controlling is further broadened.

As described above, the diode of the semiconductor device according to the first embodiment is effectively used for microwave and millimeter wave circuits and, further, the diode may be used for a hybrid Microwave IC and an MMIC with the same effect as described above.

Embodiment 2

Figure 5:
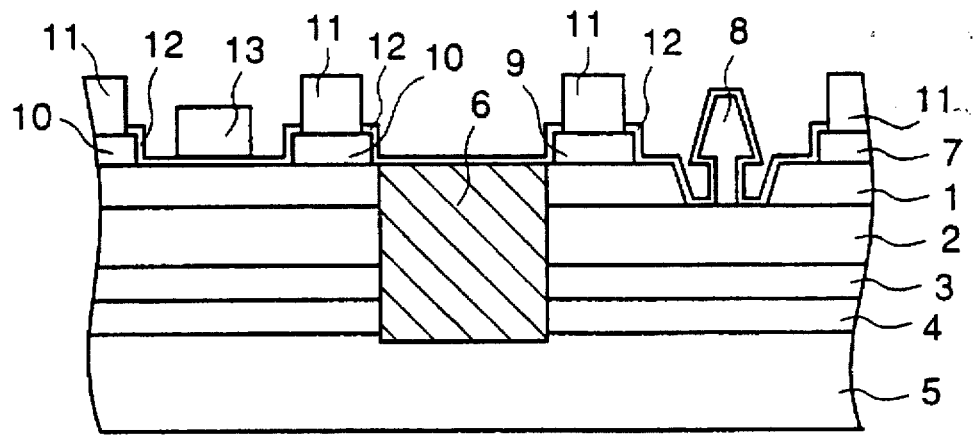
FIG. 5(a) is a sectional view illustrating a semiconductor device in accordance with a second embodiment of the present invention and FIG. 5(b) is a graph showing a relation between junction capacitance and anode voltage of the diode.
Figure 5:
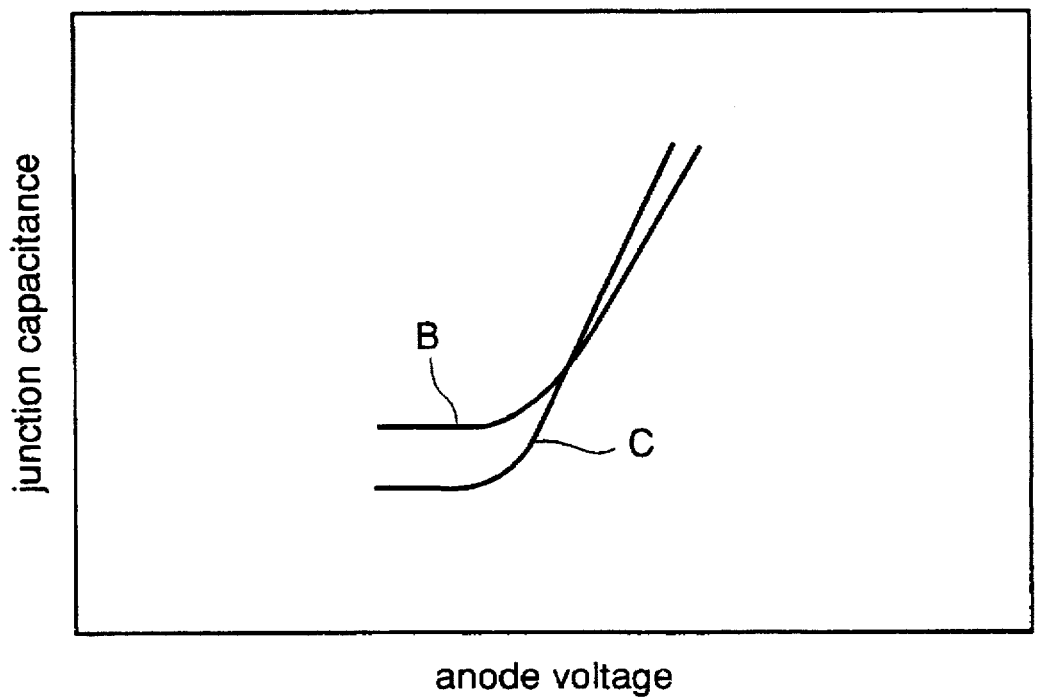

FIG. 5(a) is a cross-sectional view illustrating a semiconductor device in accordance with a second embodiment of the present invention and FIG. 5(b) is a graph showing a relation between junction capacitance and anode voltage in a diode of the semiconductor device. In FIG. 5(a), the same reference numerals as in FIG. 1(a) designate the same or corresponding parts, and a curve C shows the diode according to the second embodiment.

While of the first embodiment the anode electrode 13 in the diode is provided in the opening of the protective film 12 for direct contact between the anode electrode 13 and the cap layer 1, in the second embodiment the anode electrode 13 is disposed on the protective film 12 by the same fabricating method as in the first embodiment. In this case, since the protective film 12 is located directly below the anode electrode 13 in the diode 100, the region in the diode 100 where the depletion layer extends is larger than that of the semiconductor device according to the first embodiment. As shown in FIG. 5(b), in the second embodiment, the region where the anode voltage widens the capacitance of the diode 100 increases linearly. Therefore, the region where the capacitance in the diode 100 varies with the anode voltage is wider than that in the first embodiment.

Embodiment 3

Figure 6:
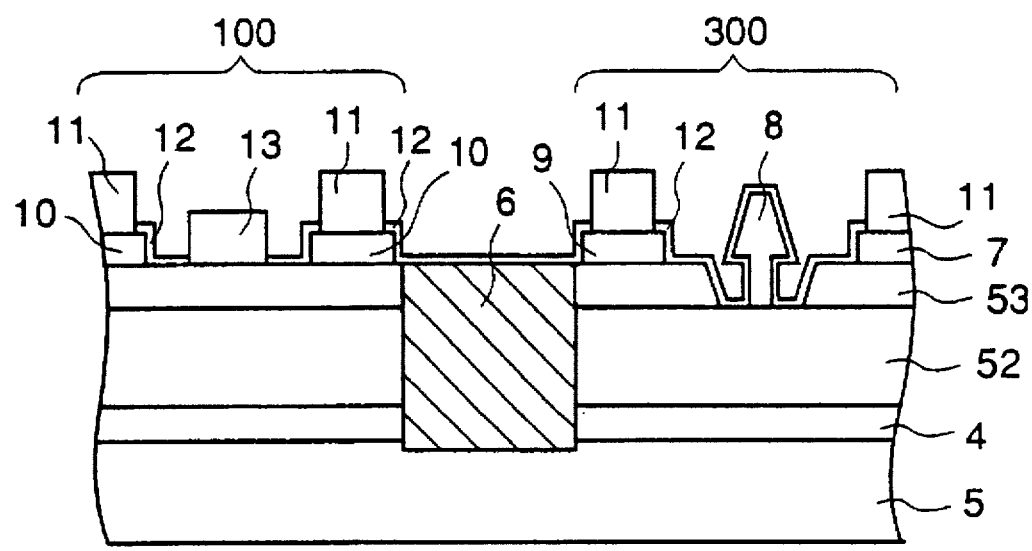
FIG. 6 is a sectional view illustrating a semiconductor device in accordance with a third embodiment of the present invention.

FIG. 6 is a cross-sectional view illustrating a semiconductor device in accordance with a third embodiment of the present invention. In FIG. 6, the same reference numerals as in FIG. 1(a) designate the same or corresponding parts. Reference numeral 300 designates a metal semiconductor field effect transistor (hereinafter referred to as MESFET). Reference numeral 52 designates an n type GaAs operating layer having a dopant concentration of $1 \times 10^{17}$–$3 \times 10^{18} cm^{-3}$. Reference numeral 53 designates a GaAs cap layer having a higher dopant concentration than the operating layer 52, for example about 10 times higher.

The semiconductor device according to the third embodiment is fundamentally identical to the semiconductor device according to the first embodiment except that the semiconductor laminated layer structure includes the buffer layer 4, the operating layer 52, and the cap layer 53, and the MESFET 300 is provided on the semiconductor laminated layer structure as the transistor instead of the HEMT. After the buffer layer 4, the operating layer 52, and the cap layer 53 are successively epitaxially grown on the semiconductor substrate 5, electrodes are formed by the same fabricating method as in the first embodiment, thereby completing this semiconductor device as shown in FIG. 6.

A description is given of an operation. In the MESFET 300, size of the depletion layer formed in the operating layer 52 below the gate electrode 8 varies in response to the voltage applied to the gate electrode 8, and a current flowing between the source electrode 7 and the drain electrode 9 is controlled. In the diode 100, the capacitance of the diode is varied by controlling the size of the depletion layer formed opposite the anode electrode 13 by the anode voltage.

A conventional semiconductor device, in which a MESFET including a cap layer for reducing the ohmic resistance and a diode are integrated on the same semiconductor laminated layer structure, simplifies the fabricating process as in the above-described prior art semiconductor device in which the HEMT and the diode are integrated on the same semiconductor laminated layer structure. Namely, a part in the diode where the anode electrode is to be formed has the same recess as the part in the MESFET where the gate electrode is formed and, the anode electrode is directly disposed on the operating layer below the cap layer to form the gate electrode and the anode electrode at the same time. In this case, as in the prior art semiconductor device, the region in the diode where the depletion layer extends is limited to the operating layer, thereby narrowing the region where the depletion layer is controlled.

In the semiconductor device according to the third embodiment, the anode electrode 13 is disposed on the cap layer 53, whereby the thickness of the active layer below the anode electrode 13, i.e., a layer including charge carriers, is the sum of the cap layer 53 and the operating layer 52 and is larger than when the anode electrode 13 is disposed on the operating layer in the recess as in the prior art. Therefore, the region in the diode 100 in which the depletion layer extends is wider than that in the prior art, and the variable width of the capacitance in the diode 100 is widened, whereby the region where the capacitance in the diode 100 varies linearly in response to the anode voltage is broadened.

According to the third embodiment, the semiconductor device includes a semiconductor laminated layer structure in which the buffer layer 4, the operating layer 52, and the cap layer 53 are disposed on the semiconductor substrate 5; the diode 100 including the cathode electrode 10 is disposed on the cap layer 53 and makes an ohmic contact with the cap layer 53, and the anode electrode 13 disposed on the cap layer 53 and makes a Schottky contact with the cap layer 53; and the MESFET 300 including the gate recess 8a is disposed on the cap layer 53 reaching the operating layer 52, the gate electrode 8 is disposed on the operating layer 52 exposed in the recess 8a and makes a Schottky contact with the operating layer 52, and the source electrode 7 and the drain electrode 9 are disposed on regions of the cap layer 53 on opposite sides of the recess 8a and makes an ohmic contact with the regions. Therefore, in the semiconductor device in which the diode and the MESFET are integrated on the same semiconductor laminated layer structure, the region in the diode where the depletion layer extends is broadened, whereby the region where the capacitance in the diode varies linearly is widened.

Embodiment 4

Figure 7:
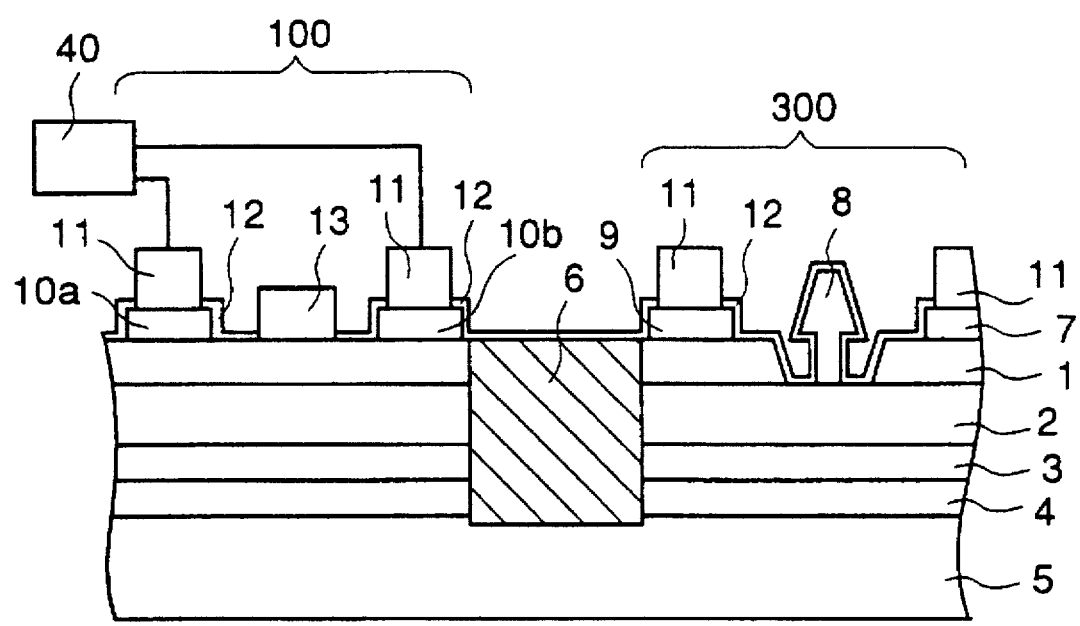
FIG. 7 is a sectional view illustrating a semiconductor device in accordance with a fourth embodiment of the present invention.

FIG. 7 is a cross-sectional view illustrating a semiconductor device in accordance with a fourth embodiment of the present invention. In FIG. 7, the same reference numerals as in FIG. 1(a) designate the same or corresponding parts. Reference numeral 40 designates a voltage applying means for applying two voltages having different potentials, for example, a power circuit outputting two different voltages. Numerals 10a and 10b designate first and second cathode electrodes, respectively.

Figure 8:
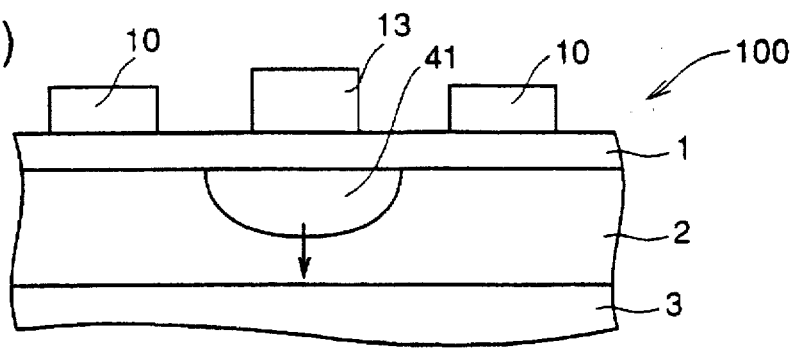
FIGS. 8(a)–8(c) are sectional views for explaining operation of the semiconductor device according to the fourth embodiment and FIG. 8(d) is a graph showing a relation between anode voltage and junction capacitance a potential difference is applied between the cathode electrodes.
Figure 8:
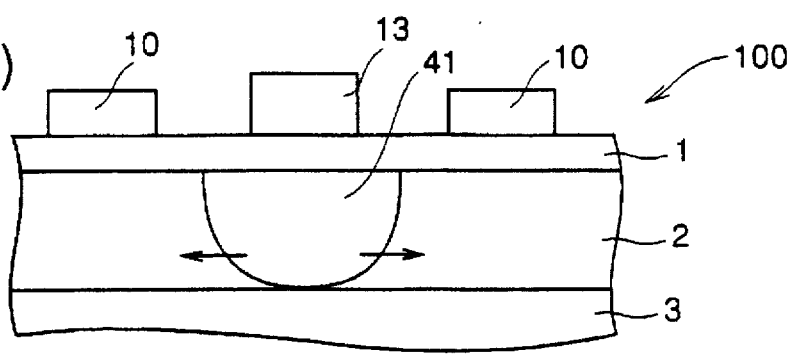
Figure 8:
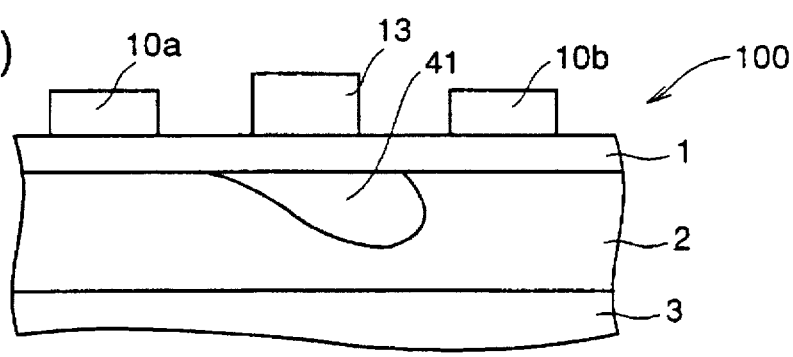
Figure 8:
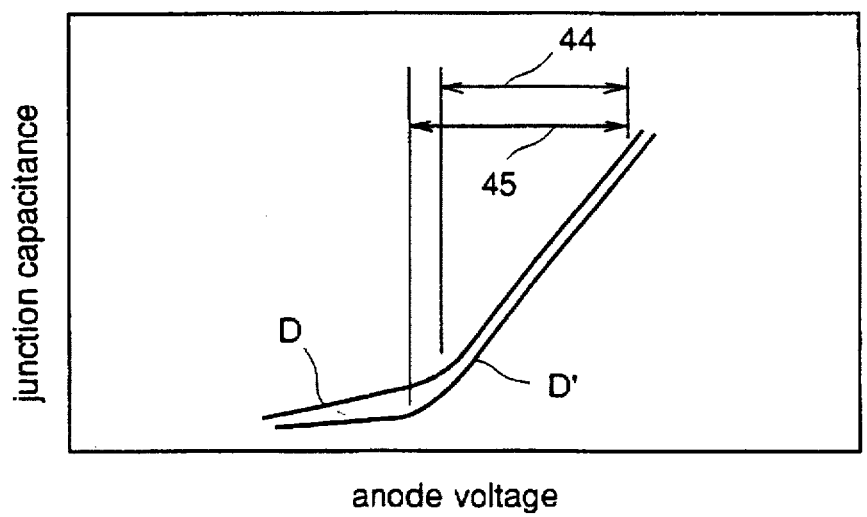

FIGS. 8(a)–8(c) are cross-sectional views of a main part of the semiconductor device for explaining operation of the semiconductor device according to the fourth embodiment of the invention, and FIG. 8(d) is a graph showing a relation between anode voltage and junction capacitance when a potential difference is applied between the cathode electrodes. In these figures, the same reference numerals as in FIG. 1(a) designate the same or corresponding parts. Reference numeral 41 designates a depletion layer. Reference numerals 44 and 45 designate regions where the junction capacitance varies linearly, respectively. A curve D shows the diode capacitance when no potential difference is applied between the cathode electrodes, and D' shows the diode capacitance when a potential difference is applied between the cathode electrodes.

The semiconductor device according to the fourth embodiment is fundamentally identical to the semiconductor device according to the first embodiment except that two cathode electrodes 10a and 10b are disposed in the diode 100, equally spaced from and at opposite sides of the anode electrode 13, and not short-circuited to each other. Each of the cathode electrodes 10a and 10b is connected to the means 40 and receives different voltages.

Usually, a cross section of the depletion layer 41 directly below the anode electrode 13 in the diode 100 is a semi-elliptic shape and symmetrical about the center of the anode electrode 13 as shown in FIG. 8(a). In the step of FIG. 8(b), when the voltage is applied so that the depletion layer 41 extends outward from the anode electrode 13 without applying any potential difference between the cathode electrodes 10 as in the first embodiment, the depletion layer 41 reaches the interface between the electron supply layer 2 and the electron transit layer 3 and extends horizontally. Here, the capacitance in the diode 100 does not vary linearly with the anode voltage.

According to the fourth embodiment, as shown in FIG. 8(c), when a small potential difference is applied between the cathode electrodes 10a and 10b, for example when the cathode electrode 10b had higher electrical potential, the depletion layer 41 extends to the side of the cathode electrode 10b and has an inclination. Therefore, the distance to the location where the depletion layer 41 reaches the interface between the electron supply layer 2 and the electron transit layer 3 is longer than the case where the depletion layer 41 extends directly below the anode electrode 13 without applying a potential difference between the cathode electrodes 10a and 10b, whereby the region where the capacitance in the diode 100 varies linearly with the anode voltage is wider than the case where no potential difference is applied. As shown in FIG. 8(d), the region where the capacitance in the diode 100 varies linearly with the anode voltage is widened by applying a potential difference between the cathode electrodes 10a and 10b.

While in the fourth a potential difference is applied between the cathode electrodes in the diode, in the present invention a similar structure may be applicable to a semiconductor device according to the third embodiment with the same effects as in the fourth embodiment.

Embodiment 5

Figure 9:
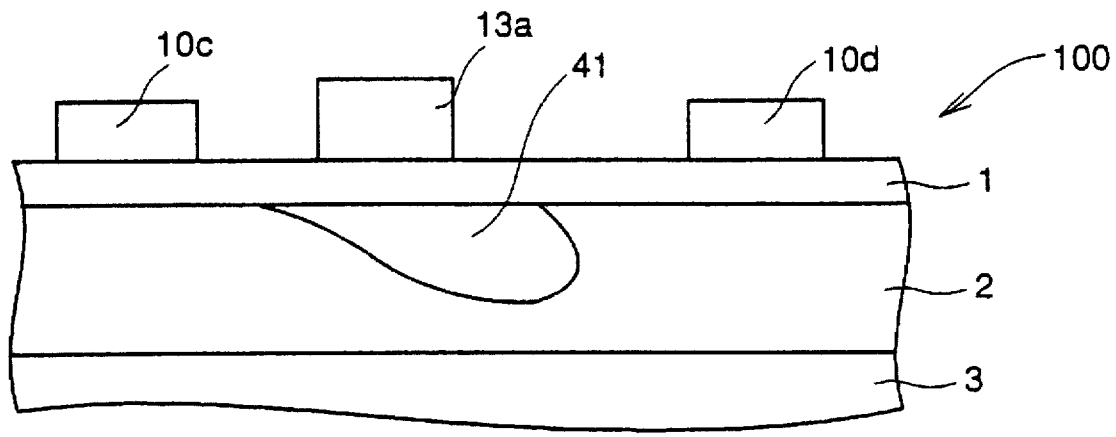
FIG. 9 is a sectional view illustrating a diode of a semiconductor device in accordance with a fifth embodiment of the present invention.

FIG. 9 is a cross-sectional view illustrating a diode of a semiconductor device in accordance with a fifth embodiment of the present invention. In FIG. 9, the same reference numerals as in FIG. 8(c) designate the same or corresponding parts. Reference numerals 10c and 10d designate cathode electrodes which are short-circuited to each other. Reference numeral 13a designates an anode electrode located at a position offset from a center position between the cathode electrodes 10c and 10d the cathode electrode 10c.

The semiconductor device according to the fifth embodiment is fundamentally identical to the semiconductor device according to the first embodiment except that the cathode electrodes 10c and 10d which are short-circuited to each other in the diode 100 are provided, and the anode electrode 13a is located at a position offset from a midway point between the cathode electrode 10c and 10d toward the cathode electrodes 10c and.

In the semiconductor device according to the fifth embodiment, since the cathode electrodes 10c and 10d short-circuited to each other are provided and the anode electrode 13a is located at a position offset from a midway point between these electrodes toward one of these electrodes, when a negative voltage is applied to the anode electrode 13a, the depletion layer 41 formed below the anode electrode 13a extends from directly below the anode electrode 13a toward the substrate direction and inclined toward the electrode farther from the anode electrode 13a. For example, as shown in FIG. 9, when the anode electrode 13a is located close to the cathode electrode 10c, the depletion layer 41 extends with an inclination toward the cathode electrode 10d, whereby the region where the depletion layer extends is widened as compared with the case where the anode electrode 13a is located in the center of the cathode electrodes, with the same effects as in the fourth embodiment.

While in the fifth embodiment the anode electrode is located at a position offset from the center of the cathode electrodes in the diode, in the present invention a similar structure may be applicable to the semiconductor device according to the third embodiment with the same effects as in the fifth embodiment.

While in the first to fifth embodiments emphasis has been placed upon a semiconductor device using a GaAs substrate, a semiconductor device using an InP substrate or another substrate is also within the scope of the present invention. Also in this case, the same effects as described in the first to fifth embodiments are achieved.

While in the first to fifth embodiments emphasis has been placed upon a semiconductor layer including an n type dopant impurity as the electron supply layer and the operating layer, a semiconductor layer including a p type dopant impurity is also within the scope of the present invention. Also in this case, the same effects as described in the first to fifth are achieved.

While in the first to fifth embodiments an HEMT or an MESFET is used as the transistor which is integrated on the same semiconductor laminated layer structure as the diode, in the present invention any transistor including a cap layer for ohmic contact may be used with the same effects as in the first to fifth embodiments.

Embodiment 6

Figure 10:
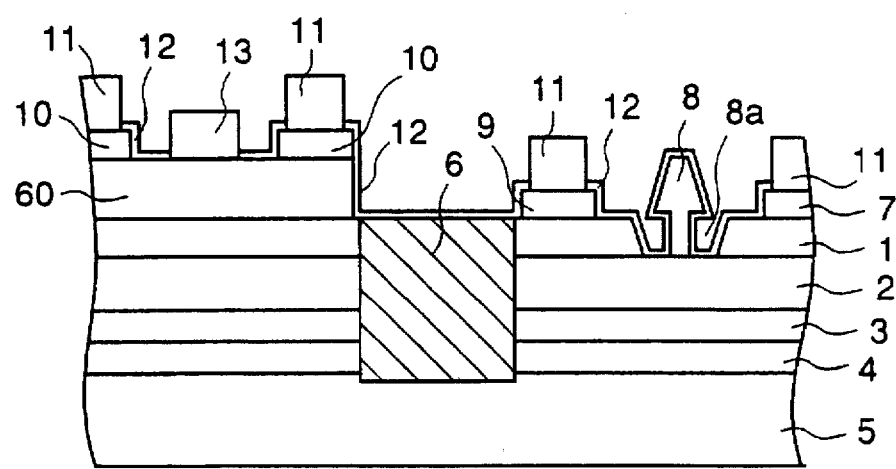
FIG. 10 is a sectional view illustrating a semiconductor device in accordance with a sixth embodiment of the present invention.

FIG. 10 is a cross-sectional view illustrating a semiconductor device in accordance with a sixth embodiment of the present invention. In FIG. 10, the same reference numerals as in FIG. 1(a) designate the same or corresponding parts. Reference numeral 60 designates an epitaxial layer comprising the same material as the cap layer 1.

FIGS. 11(a)–11(d) are cross-sectional views illustrating a method of fabricating a semiconductor device according to the sixth embodiment of the invention. In these figures the same reference numerals as in FIG. 10 designate the same or corresponding parts.

A description is given of the fabricating method. Initially, in the step of FIG. 11(a), the buffer layer 4, the electron transit layer 3, the electron supply layer 2, and the cap layer 1 are successively epitaxially grown on the semi-insulating semiconductor substrate 5 to form the semiconductor laminated layer structure. The isolation region 6 is formed at a region other than the regions where the diode and the transistor are to be formed by implanting ions, such as proton, for isolation. Instead of using epitaxial growth, a similar semiconductor laminated layer structure may be formed on the semiconductor substrate by ion implantation.

Subsequently, in the step of FIG. 11(b), the epitaxial layer 60 for forming the diode is epitaxially grown on the semiconductor laminated layer structure. The epitaxial layer 60 is not required to have a complicated structure as the semiconductor laminated layer structure used for the HEMT. As in the sixth embodiment, the epitaxial layer 60 may be a single-layer structure comprising the same material as the cap layer 1 for reducing ohmic resistance, a layer including a dopant impurity with a higher dopant concentration than the cap layer 1, a structure in which a low dopant concentration layer for obtaining reverse direction voltage is employed as a Schottky formation layer, and a structure in which a medium dopant concentration layer is disposed directly below the low dopant concentration layer to reduce channel resistance. That is, any epitaxial layer including a dopant impurity and forming a conventional diode may be employed.

Figure 11:
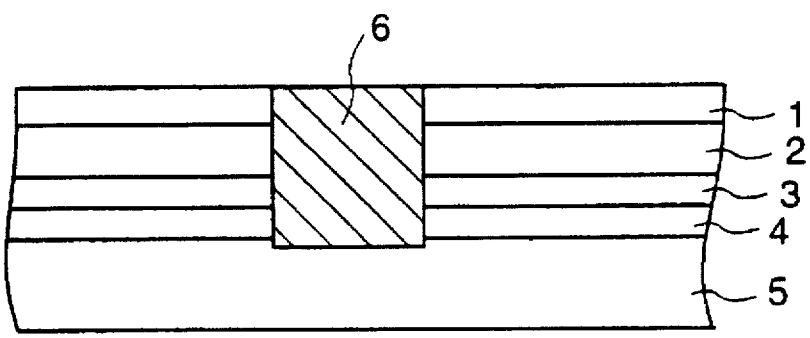
FIGS. 11(a)–11(d) are sectional views illustrating a method of fabricating the semiconductor device according to the sixth embodiment.
Figure 11:
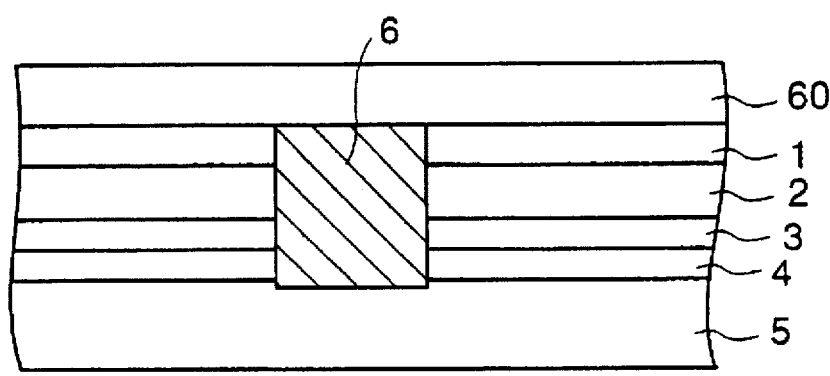
Figure 11:
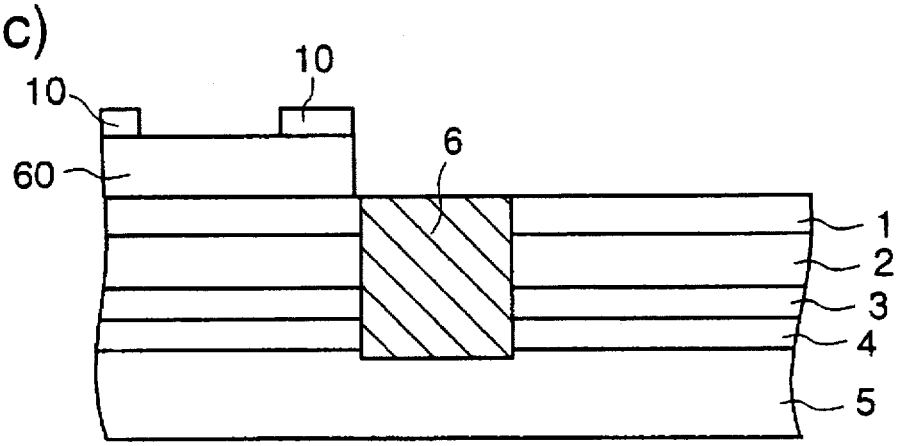
Figure 11:
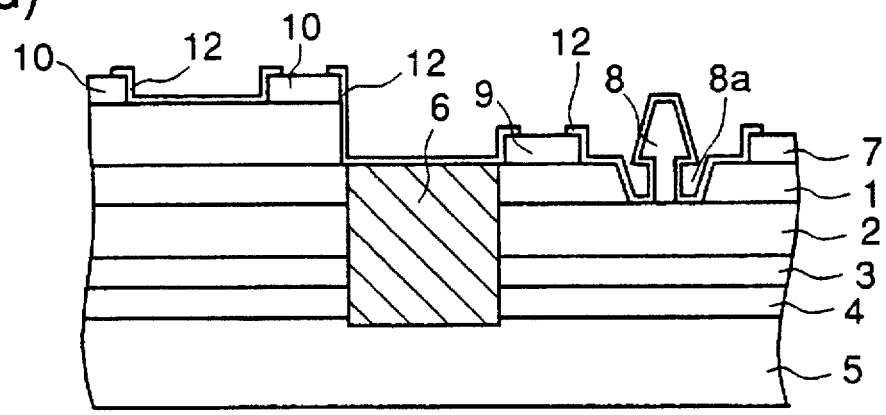

Next, in the step of FIG. 11(c), an electrode metal is deposited on the region of the epitaxial layer 60 where the diode is to be formed by evaporation or sputtering, using a mask, to form the cathode electrodes 10 and, then, the epitaxial layer 60 where no diode is formed is etched and removed. In order to easily control an etching depth direction, an etch stopping layer may be provided between the epitaxial layer 60 and the cap layer 1 in advance.

Thereafter, the HEMT 200 is formed by the same method as in the first embodiment and, then the protective film 12 is formed on the whole structure. A region of the protective film 12 where the anode electrode is to be formed and regions of the protective film disposed on the respective electrodes are etched and removed as shown in FIG. 11(d). Thereafter, the wiring metal layer 11 and the anode electrode 13 comprising the same material as the wiring metal layer 11 are formed.

In the sixth embodiment, after forming the semiconductor laminated layer structure required for forming the HEMT 200, the epitaxial layer 60 is disposed on the semiconductor laminated layer structure where the diode 100 is to be formed and the diode is formed on the epitaxial layer 60. Therefore, the region where the depletion layer formed below the anode electrode extends, which is limited by the thickness of the electron supply layer in the prior art semiconductor device, can be wider than the thickness of the electron supply layer 2. In a semiconductor device in which the diode and the transistor are formed on the same semiconductor substrate, the region in the diode 100 where the depletion layer formed below the anode electrode 13 extends is broadened, whereby the region where the capacitance in the diode 100 varies linearly is widened.

Further, since the anode electrode 13 and the wiring metal layer 11 comprise the same material, they can be simultaneously formed, whereby the fabricating method is simplified.

What is claimed is:

1. A semiconductor device comprising:
   a semiconductor substrate;
   a semiconductor laminated layer structure disposed on the substrate and comprising at least two semiconductor layers;
   a first semiconductor layer containing a first dopant impurity providing a first conductivity type, and a second semiconductor layer disposed on the first semiconductor layer, the second semiconductor layer containing the first dopant impurity in a concentration higher than in the first semiconductor layer, successively disposed on the semiconductor laminated layer structure;
   a semiconductor diode comprising a first electrode in ohmic contact with the second semiconductor layer, and a second electrode in Schottky contact with the second semiconductor layer; and
   a transistor including a recess in the second semiconductor layer and having a depth reaching the first semiconductor layer, a gate electrode in the recess and in Schottky contact with the first semiconductor layer, and a source electrode and a drain electrode disposed on opposite sides of the recess on the second semiconductor layer in ohmic contact with the second semiconductor layer.

2. The semiconductor device of claim 1 wherein the first electrode, the source electrode, and the drain electrode are respectively connected to wiring metal layers, and the second electrode comprises the same material as the wiring metal layers.

3. The semiconductor device of claim 1 including a protective film disposed on the second semiconductor layer.

4. The semiconductor device of claim 1 comprising:
   a third electrode in ohmic contact with the second semiconductor layer, the third electrode being located on an opposite side of the first electrode from the second electrode, the second and third electrodes being equidistant from the first electrode; and
   means for applying different voltages to the first electrode and the third electrode, respectively.

5. The semiconductor device of claim 1 comprising a third electrode in ohmic contact with the second semiconductor layer, the third electrode being located on an opposite side of the first electrode from the second electrode, the second electrode being located further from the first electrode than is the third electrode, and the first and third electrodes being electrically connected to each other.

6. The semiconductor device of claim 1 wherein the semiconductor laminated layer structure comprises a buffer layer, an undoped electron transit layer, an electron supply layer containing a first dopant impurity, and a cap layer containing the first dopant impurity in a higher concentration than the electron supply layer.

* * * * *